United States Patent
Brox et al.

(10) Patent No.: US 6,295,236 B1
(45) Date of Patent: Sep. 25, 2001

(54) SEMICONDUCTOR MEMORY OF THE RANDOM ACCESS TYPE WITH A BUS SYSTEM ORGANIZED IN TWO PLANES

(75) Inventors: Martin Brox, München; Karl-Peter Pfefferl, Höhenkirchen-Siegergtsbrunn, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/553,128

(22) Filed: Apr. 19, 2000

(30) Foreign Application Priority Data

Apr. 19, 1999 (DE) ............................................. 199 17 589

(51) Int. Cl.[7] ...................................................... G11C 7/00
(52) U.S. Cl. ................................. 365/200; 365/51; 365/63
(58) Field of Search ................................. 365/200, 51, 63

(56) References Cited

U.S. PATENT DOCUMENTS 5,867,439 * 2/1999 Asakura et al. ..................... 365/200
6,163,863 * 12/2000 Schicht .................................. 365/201

FOREIGN PATENT DOCUMENTS 195 13 287
A1   10/1996 (DE).

* cited by examiner

*Primary Examiner*—Huan Hoang
(74) *Attorney, Agent, or Firm*—Herbert L. Lerner; Laurence A. Greenberg; Werner H. Stemer

(57) ABSTRACT

The semiconductor memory of the random access type has data lines, which can be connected to the local data lines in the memory cell array. The data lines are combined in groups and at least one group or individual data lines of the groups are formed by redundant data lines. Input/output lines lead from the memory in groups. A bus system organized in two planes is provided. The first plane is provided with bus lines which can be connected to all of the input/output lines, on the one hand, and to all of the data lines, on the other hand. The second plane has a plurality of individual partial buses, whose bus lines can be connected to in each case all of the data lines of at least two groups of data lines, on the one hand, and to all of the input/output lines of in each case one group, on the other hand.

9 Claims, 2 Drawing Sheets

FIG 3

SEMICONDUCTOR MEMORY OF THE RANDOM ACCESS TYPE WITH A BUS SYSTEM ORGANIZED IN TWO PLANES

BACKGROUND OF THE INVENTION

1. Field of the Invention

The invention lies in the semiconductor technology field. More specifically, the invention relates to a semiconductor memory of the random access type having data lines, which can be connected to the local data lines in the memory cell array. The data lines are combined in groups and at least one group or individual data lines of the groups are formed by redundancy data lines. I/O lines (input/output lines) lead from the memory in groups.

In a typical architecture of a 64-Mbit DRAM, the memory area is divided into four quadrants each with a data width of 32 bits. The entire memory comprises 128 bits. The 32-bit-wide data buses of the quadrants are further subdivided into four groups each of 8 bits. The data lines of the data buses are configured such that they can be connected to input/output lines I/O leading from the memory.

Previous designs of DRAMs have been provided with at least one redundant data line per group or a complete redundant group. A group in this case comprises a number of data lines.

In the case of this design of redundancy within a group, interconnection between the groups is not provided. This approach has the disadvantage that the maximum possible number of data lines that can be replaced within the group corresponds to the number of redundant lines per group.

In modern semiconductor memories, in which advancing technology is leading to smaller and smaller structures, contamination or other disruptive parameters such as, for example, layer thickness fluctuations in the fabrication process constitute a cause of defects which extend over a plurality of data lines or memory cells.

Thus, an areal defect, a so-called cluster defect which extends over a plurality of bit lines or memory cells can cause the on-chip redundancy devices within the memory chip which are designed according to the prior art to rapidly come up against their limits. In the case of a cluster defect, the number of data lines that may be affected in a group may be more than the number of redundant lines available in the group. In such a case, the entire memory chip can no longer be used, resulting in a total failure.

Moreover, defects, and in particular including cluster defects, of the local data lines internal to the memory or of the data lines are not precluded even in the course of fabrication. As a result, whole groups of local data lines which are assigned to the defective data line fail and have to be replaced. In such a case, the system of redundancy data lines limited to a group fails completely.

SUMMARY OF THE INVENTION

The object of the invention is to provide a semiconductor memory of the random access type with a bus system organized in two planes which overcomes the above-noted deficiencies and disadvantages of the prior art devices and methods of this kind, and in which a flexible assignment of the redundancy data lines to different groups is made possible, which assignment also enables redundancy data lines of different groups to be assigned to one or more groups.

With the above and other objects in view there is provided, in accordance with the invention, a random access semiconductor memory, comprising:

a memory cell array with a multiplicity of memory cells;

a plurality of data lines connectible to the memory cells in the memory cell array, the data lines being combined in groups and at least one of the groups or individual data lines of the groups being formed by redundancy data lines;

input/output lines leading from the memory in groups;

a bus system organized in two planes including a first plane and a second plane, the first plane having bus lines to be connected to all the input/output lines and to all of the data lines, and the second plane having a plurality of individual partial buses with bus lines to be connected between the data lines of at least two of the groups of data lines and the input/output lines of one respective group of input/output lines.

In other words, the invention provides for a bus system organized in two planes, the first plane being provided with bus lines which can be connected to all of the input/output lines, on the one hand, and to all of the data lines, on the other hand, and the second plane having a plurality of individual partial buses, whose bus lines can be connected to in each case all of the data lines of at least two groups of data lines, on the one hand, and to all of the input/output lines of in each case one group, on the other hand.

The invention thus proposes that all of the data lines of the memory shall be connected, or be kept able to be connected, to all of the input/output lines of the memory via the first and second planes of the bus system. What is advantageous in this case is that redundancy data lines, which may be formed by other data lines of the memory, of a plurality of groups located apart from one another can be assigned to one group, in order to replace defective data lines. The flexibility achieved in this case is limited only by the total number of redundant data lines.

In accordance with an added feature of the invention, switches are connected between the bus lines of the bus system and the data lines or The input/output lines. In this particularly preferred embodiment of the invention, the bus lines of the first or of the second plane of the bus system are connected to the data lines and to the input/output lines via switches. The advantage in this case is that the connection of a data line to an input/output line can be switched reversibly, as required, by a switch.

In a further preferred refinement of the invention, the switches are formed by a tristate buffer circuit ("tristate buffer"). The advantage of a tristate buffer circuit is that the connection can be switched reversibly, and that in the case of an unrequired connection (open), leakage currents or capacitive loads hardly occur.

In accordance with an alternative embodiment of the invention, the switches are irreversibly set elements.

In accordance with a preferred embodiment of the invention, it is provided that the switches are actuated by means of predetermined state values.

It is advantageous for the state values for actuating the switches to be held in a read-only memory integrated in the semiconductor memory. Accordingly, the read-only memory is formed by a programming device with elements ("fuses" and "antifuses") that can be set irreversibly.

In a concomitant, particularly preferred refinement of the invention, the state values for actuating the switches are obtained after a function and redundancy test of the semiconductor memory has been carried out.

Other features which are considered as characteristic for the invention are set forth in the appended claims.

Although the invention is illustrated and described herein as embodied in a semiconductor memory of the random access type with a bus system organized in two planes, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Only the components of a semiconductor memory which are essential for an understanding of the invention are illustrated schematically in the figures. Further, the individual memory cells and their configuration and arrangement, as well as the additional circuit components (decoders, amplifiers, control devices) which serve for addressing the memory cells are familiar to those of skill in the art and they have, therefore, been omitted in order to simplify the illustration.

Figure 1:
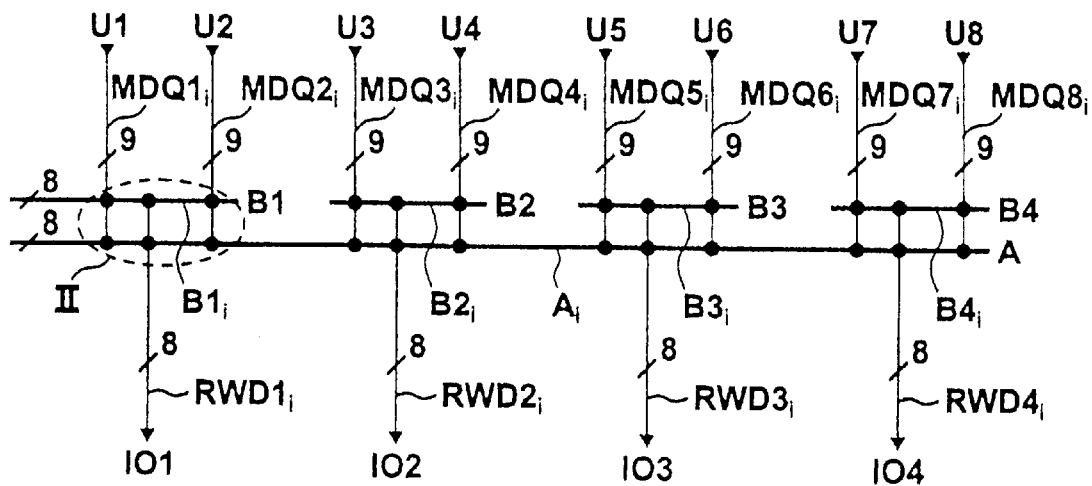
FIG. 1 is a schematic illustration of a semiconductor memory according to the invention with a bus system organized in two planes.

Referring now to the figures of the drawing in detail and first, particularly, to FIG. 1 thereof, there is seen a schematic illustration of a semiconductor memory 1 according to the invention. Eight data lines $MDQi_j$ each are combined in groups U1 to U8 and can be connected to the in each case eight I/O lines $RWDi_j$ combined in groups IO1 to IO4 via the bus system organized in two planes A and B. In this case, the bus system in the first plane A is composed of eight bus lines $A_1$ to $A_8$, which can be connected to all sixty-four data lines $MDQ1_1$ to $MDQ8_8$ of all the groups U1 to U8, eight redundancy data lines $MDQ1_R$ to $MDQ8_R$—these are designed in the form of eight additional data lines in the circuit example shown here—and the thirty-two IO lines $RWD1_1$ to $RWD4_8$ of all the groups IO1 to IO4, and the bus system in the second plane is composed of partial buses B1 to B4, whose eight bus lines $Bi_1$ to $Bi_8$ can be connected to in each case two groups of in each case eight data lines $MDQi_1$ to $MDQi_8$ and the redundancy data line $MDQi_R$ thereof and in each case one group of eight IO lines $RWDi_1$ to $RWDi_8$. In the event of a data access to the memory cells (which are not specifically illustrated in the figures), either the even-numbered (U2, U4, U6, U8) or the odd-numbered (U1, U3, U5, U7) groups of data lines are connected to the groups IO1 to IO4 of the IO lines.

Some of the data lines $MDQi_j$ of a group Ui are formed by data lines $MDQi_R$ which are redundant in the case of a memory that has been fabricated "defect-free", that is to say without any defective memory cells or data lines. The data lines $MDQi_R$ are what are known as redundancy data lines (in each case one of the data lines of a group $U_i$ in the present example). If these are not required, they are not connected via the bus system designed in two planes A and B to the IO lines $RWDi_j$ leading from the memory. However, if individual data lines of the data lines $MDQ1_1$ to $MDQ8_8$ turn out to be defective, then these are not connected to the IO lines by means of the bus system but rather a corresponding number of redundancy data lines of the redundancy data lines $MDQ1_R$ to $MDQ8_R$. Data lines may have a defective nature because of defective memory cells or areas assigned to them via the local data lines situated in the memory cell array, and because of faults of the data line or of the local data lines themselves.

It is also possible, with the aid of the bit lines or of the local bit lines, for defective memory cells to be replaced by redundant memory cells by means of suitable wiring. In this case, it is possible to dispense with an additional redundant data line $MDQi_R$. In order to connect the data line carrying the data of the redundant memory cells, the bus system can be operated in the same way as if there were an additional data line for this purpose.

Figure 2:
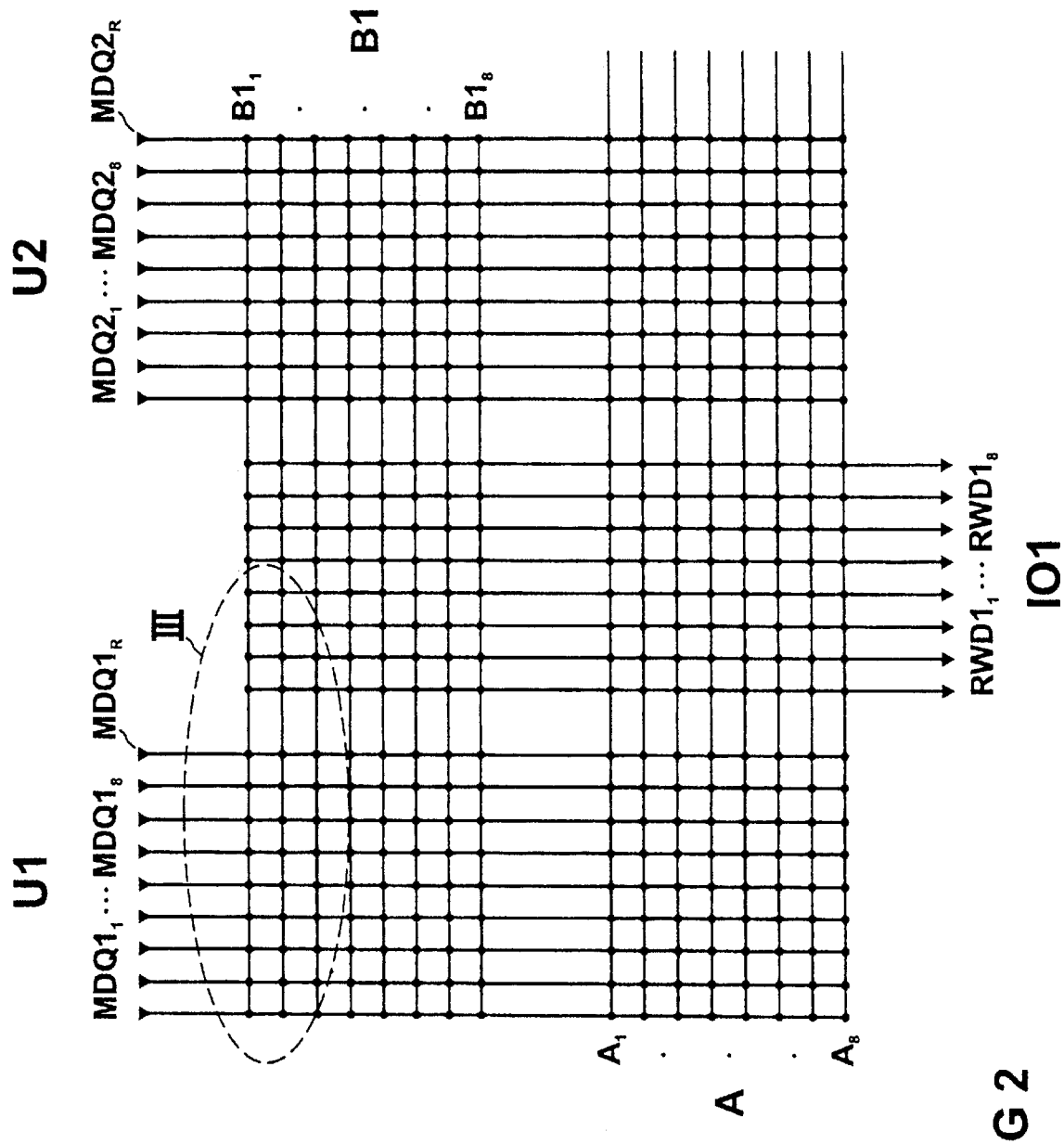
FIG. 2 is an enlarged schematic view of the detail II in FIG. 1.

FIG. 2 shows an enlargement of the detail II shown in FIG. 1. The following are illustrated: the data lines $MDQ1_1$ to $MDQ1_8$ of the first group U1, a redundancy data line $MDQ1_R$, and the data lines $MDQ2_1$ to $MDQ2_8$ and $MDQ2_R$ of the second group U2, the bus lines $B1_1$ to $B1_8$ of the first partial bus B1, the IO lines $RWD1_1$ to $RWD1_8$ of the first group IO1 of I/O lines, and the bus lines $A_1$ to $A_8$ of the bus of the first plane A. The latter are connected to all of the other data, redundancy data, and I/O lines.

Figure 3:
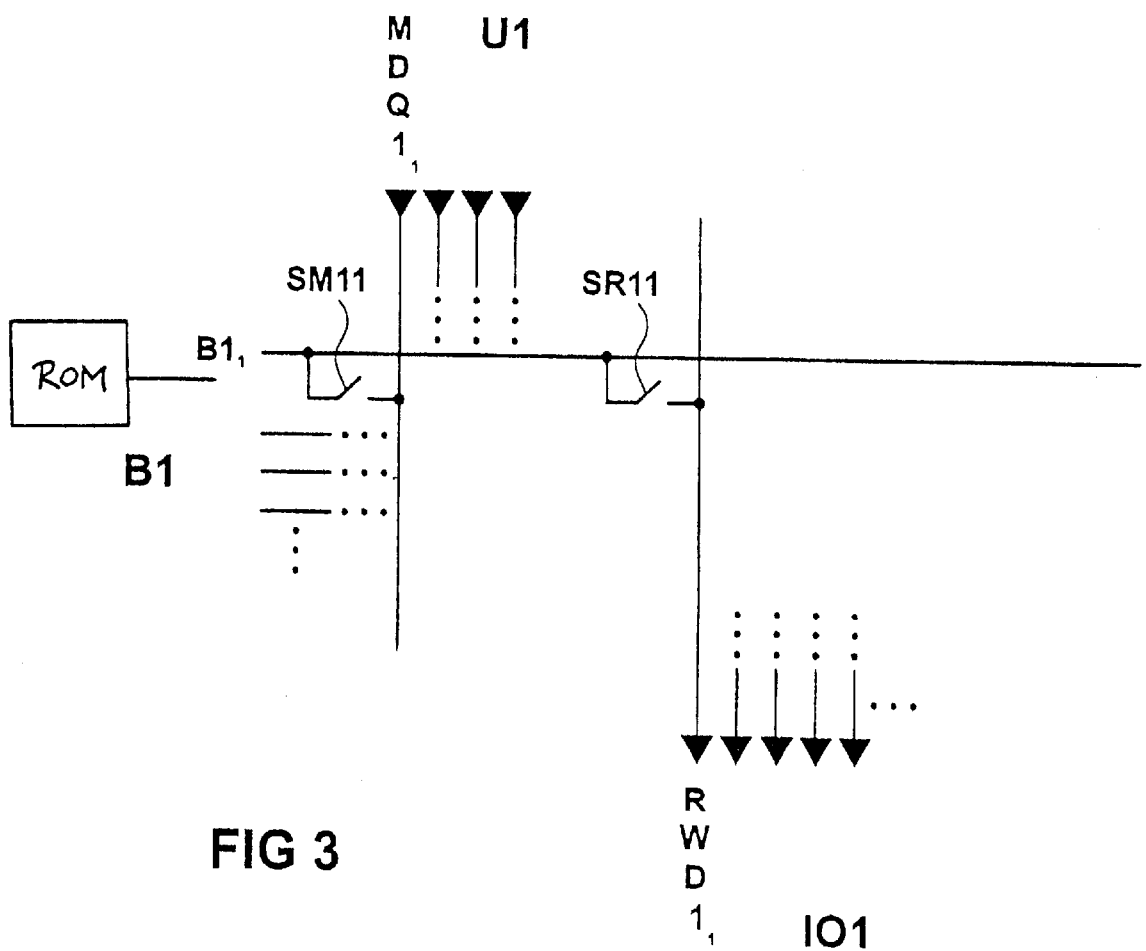
FIG. 3 is an enlarged schematic view of the detail III in FIG. 2.

Referring now to FIG. 3, which is an enlargement of the portion designated by III in FIG. 2, there are shown switches SM11 and SR11 for the connection of the first bus line $B1_1$ of the first partial bus B1 to the first data line $MDQ1_1$ of the first group U1 of data lines and to the first IO line $RWD1_1$ of the first group IO1 of I/O lines. In this case, according to the invention, the switches SRii and SMii may be formed by so-called "fuses" or "antifuses" which are set permanently (irreversibly) in the course of the first initialization of the memory during the testing thereof. Equally, the switches SRii and SMii may be formed within a tristate buffer circuit.

A tristate buffer circuit has the advantage that it does not close the switches irreversibly, which, in the event of deactivation (opening) of the switches, leads to very high-resistant and low-capacitance contacts and thus to small loads. Moreover, the tristate buffer circuit may serve for connecting the even-numbered or odd-numbered groups of data lines to the I/O lines in the event of a data access, which would save the space that would be taken up by a further circuit for doing so. The actuation of the individual switches of the redundancy data lines and of the defective data lines within the tristate buffer circuit can again be effected by "fuses" or "antifuses" or similar programmable read-only memories ROM, which are programmed according to the results of the memory test. In this case, in so far as it is possible, defective data lines are also expediently replaced by redundancy data lines by the connection of the short bus lines $Bi_j$ of the second plane B of the bus system instead of the long bus lines $A_j$ of the first plane A, which minimizes the required driver power.

By virtue of the thus highly flexible assignment system of short partial bus lines $Bi_j$ of the partial buses B1 to B4 and relatively few long bus lines A1 to A8 of the first plane A of the bus system, it is even possible to compensate for larger failures of a plurality of data lines of a group, caused by cluster defects. In most cases, a connection via the short partial bus lines will suffice here, which keeps the capacitive loading on the line drivers small and thus also keeps the propagation delays short.

We claim:

1. A random access semiconductor memory, comprising:

a memory cell array with a multiplicity of memory cells;

a plurality of data lines connectible to said memory cells in said memory cell array, said data lines being combined in groups and at least one of said groups or individual data lines of said groups being formed by redundancy data lines;

input/output lines leading from the memory in groups;

a bus system organized in two planes including a first plane and a second plane, said first plane having bus lines to be connected to all said input/output lines and to all of said data lines, and said second plane having a plurality of individual partial buses with bus lines to be connected between said data lines of at least two of said groups of data lines and said input/output lines of one respective group of input/output lines.

2. The semiconductor memory according to claim 1, which comprises switches connected between said bus lines of said bus system and said data lines or said input/output lines.

3. The semiconductor memory according to claim 2, wherein said switches are connected to one of said first plane and said second plane of said bus system.

4. The semiconductor memory according to claim 2, wherein said switches are tristate buffer circuits.

5. The semiconductor memory according to claim 2, wherein said switches are irreversibly set elements.

6. The semiconductor memory according to claim 2, wherein said switches are actuated by means of predetermined state values.

7. The semiconductor memory according to claim 6, wherein the state values for actuating the switches are defined after a function and redundancy test of the semiconductor memory.

8. The semiconductor memory according to claim 6, which comprises a read-only memory incorporated in the semiconductor memory for storing the state values for actuating the switches.

9. The semiconductor memory according to claim 8, wherein said read-only memory is formed by a programming device with irreversibly set elements.

* * * * *